United States Patent
Wei

(10) Patent No.: US 6,875,939 B2
(45) Date of Patent: *Apr. 5, 2005

(54) SUSPENSION CONTROL DEVICE FOR ELECTRIC APPLIANCE

(76) Inventor: Jung-Tsung Wei, 58, Ma Yuan West St., Taichung (TW)

(*) Notice: Subject to any disclaimer, the term of this patent is extended or adjusted under 35 U.S.C. 154(b) by 0 days.

This patent is subject to a terminal disclaimer.

(21) Appl. No.: 10/613,835

(22) Filed: Jul. 1, 2003

(65) Prior Publication Data

US 2004/0065532 A1 Apr. 8, 2004

Related U.S. Application Data

(63) Continuation-in-part of application No. 10/015,743, filed on Dec. 17, 2001.

(51) Int. Cl.⁷ .................................................. H01H 3/20
(52) U.S. Cl. ...................................... 200/330; 200/331
(58) Field of Search .................................. 200/330, 331

(56) References Cited

U.S. PATENT DOCUMENTS

| | | | | |
|---|---|---|---|---|
| 5,166,482 A | * | 11/1992 | Li ............................. 200/52 R |
| 5,208,516 A | * | 5/1993 | Saidian ....................... 315/362 |
| 5,396,037 A | * | 3/1995 | Moore et al. ................ 200/331 |
| 5,454,056 A | * | 9/1995 | Brothers ...................... 385/16 |
| 5,532,557 A | * | 7/1996 | Saidian ....................... 315/362 |
| 5,661,370 A | * | 8/1997 | Messick ...................... 315/158 |
| 6,295,871 B1 | * | 10/2001 | Wei ............................. 73/570 |
| 6,315,431 B1 | * | 11/2001 | Greedy ....................... 362/253 |

* cited by examiner

Primary Examiner—Michael A. Friedhofer
(74) Attorney, Agent, or Firm—Alan D. Kamrath; Nikolai & Mersereau, P.A.

(57) ABSTRACT

A suspension control device includes a mechanical switch connected to an electric appliance, a control cord having an end connected to the mechanical switch, and an electronic sensor having a first side connected to the control cord and a second side connected to the electric appliance. Thus, the suspension control device can be used to control operation of the electric appliance in a mechanical manner or an electronic manner, thereby facilitating the user operating the suspension control device to control operation of the electric appliance.

14 Claims, 5 Drawing Sheets

SUSPENSION CONTROL DEVICE FOR ELECTRIC APPLIANCE

CROSS-REFERENCES TO RELATED APPLICATIONS

The present invention is a continuation-in-part application of the co-pending U.S. Ser. No. 10/015,743, filed on Dec. 17, 2001.

BACKGROUND OF THE INVENTION

1. Field of the Invention

The present invention relates to a suspension control device, and more particularly to a suspension control device having a double control function.

2. Description of the Related Art

A conventional suspension control device in accordance with the prior art shown in FIGS. 1–4 comprises a control cord 1 having a first end connected to an electric appliance (not shown) and a second end provided with a pull tab 11. Thus, when the control cord 1 is pulled downward, the switch (not shown) of the electric appliance is switched so as to control operation of the electric appliance.

In operation, the user's hand touches the control cord 1 as shown in FIG. 1. Then, the user's hand holds the pull tab 11 of the control cord 1 as shown in FIG. 2. Then, the user's hand exerts a force on the pull tab 11 of the control cord 1 to pull the control cord 1 downward as shown in FIG. 3. Finally, the user's hand releases the pull tab 11 of the control cord 1 as shown in FIG. 4.

However, as shown in FIG. 3, the moving direction of the control cord 1 has to be vertical to the switch of the electric appliance. If the moving direction of the control cord 1 is not vertical to the switch of the electric appliance, the switch of the electric appliance cannot be switched at a normal state or will be inoperative, so that movement of the control cord 1 has a directional limit, thereby causing inconvenience to the user in operation. In addition, when the pulling force applied on the control cord 1 is too large, the switch of the electric appliance is easily worn out, and when the pulling force applied on the control cord 1 is too small, the switch of the electric appliance is not operated, thereby causing inconvenience to the user in operation.

SUMMARY OF THE INVENTION

The primary objective of the present invention is to provide a suspension control device having a double control function.

Another objective of the present invention is to provide a suspension control device that can be used to control operation of the electric appliance in a mechanical manner or an electronic manner, thereby facilitating the user operating the suspension control device to control operation of the electric appliance.

A further objective of the present invention is to provide a suspension control device, wherein the suspension control device can be used to operate the electric appliance easily and conveniently without a directional limit.

A further objective of the present invention is to provide a suspension control device, wherein the user can operate the suspension control device easily and conveniently without having to exert a large force on the suspension control device.

A further objective of the present invention is to provide a suspension control device, wherein the electronic sensor is connected to the mechanical switch in a parallel manner, so that when the control cord is pulled downward by the user or when the user's one hand touches or approaches the control cord, the electronic sensor and the mechanical switch can produce the control signal simultaneously to control operation of the electric appliance.

A further objective of the present invention is to provide a suspension control device, wherein when one of the electronic sensor and the mechanical switch is inoperative or worn out, the electric appliance can be operated at the normal state.

A further objective of the present invention is to provide a suspension control device, wherein the user can pull, touch or approach the control cord so as to control operation of the electric appliance, so that the suspension control device satisfies the requirements and customs of different users.

In accordance with the present invention, there is provided a suspension control device, comprising:

a mechanical switch connected to an electric appliance;

a control cord having an end connected to the mechanical switch; and an electronic sensor having a first side connected to the control cord and a second side connected to the electric appliance.

Further benefits and advantages of the present invention will become apparent after a careful reading of the detailed description with appropriate reference to the accompanying drawings.

DETAILED DESCRIPTION OF THE INVENTION

Figure 1:
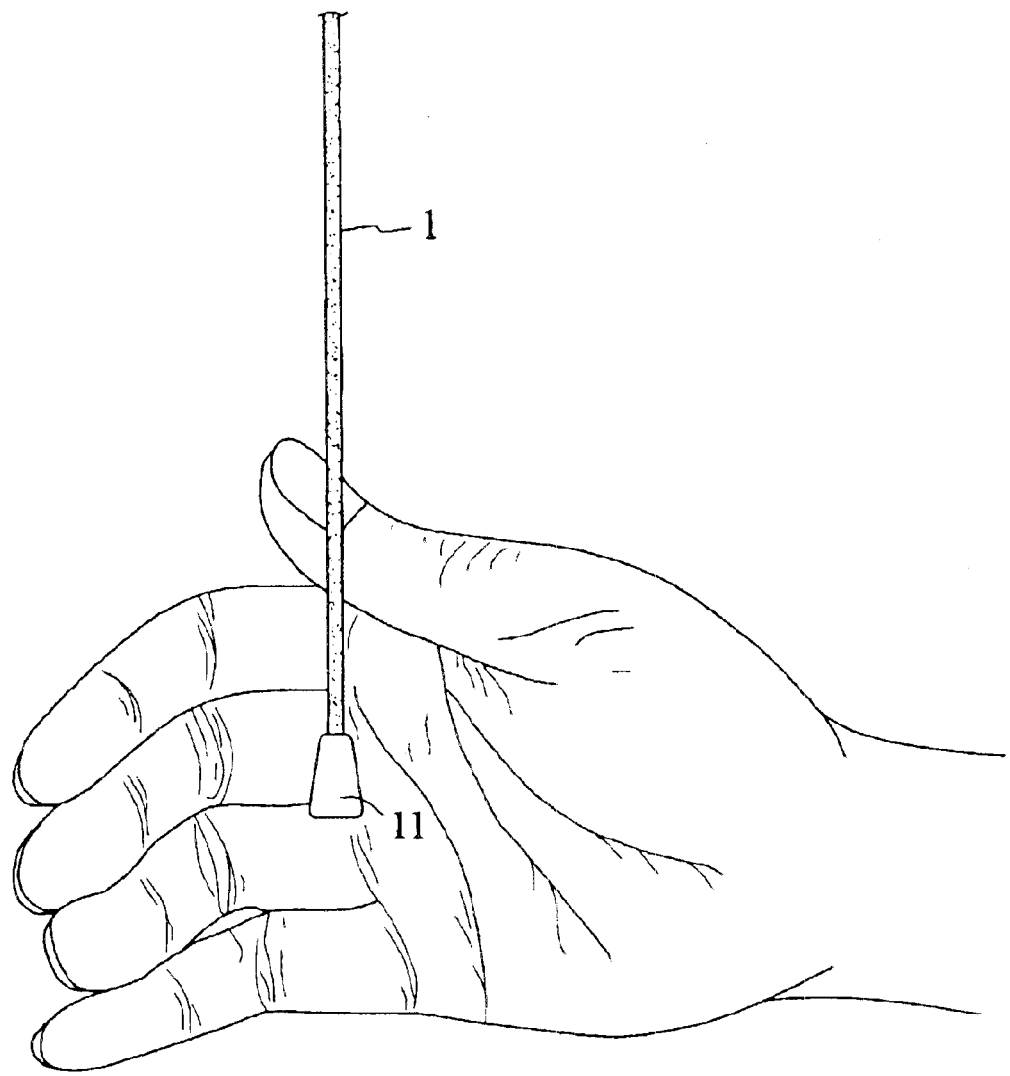
FIG. 1 is a schematic operational view of a conventional suspension control device in accordance with the prior art.
Figure 2:
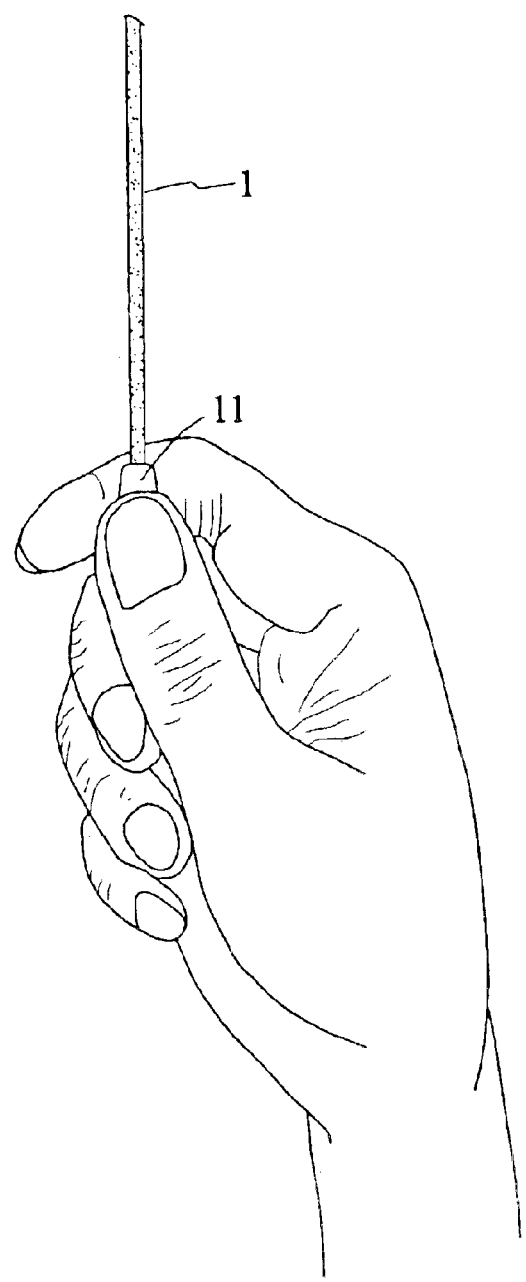
FIG. 2 is a schematic operational view of the conventional suspension control device in accordance with the prior art.
Figure 3:
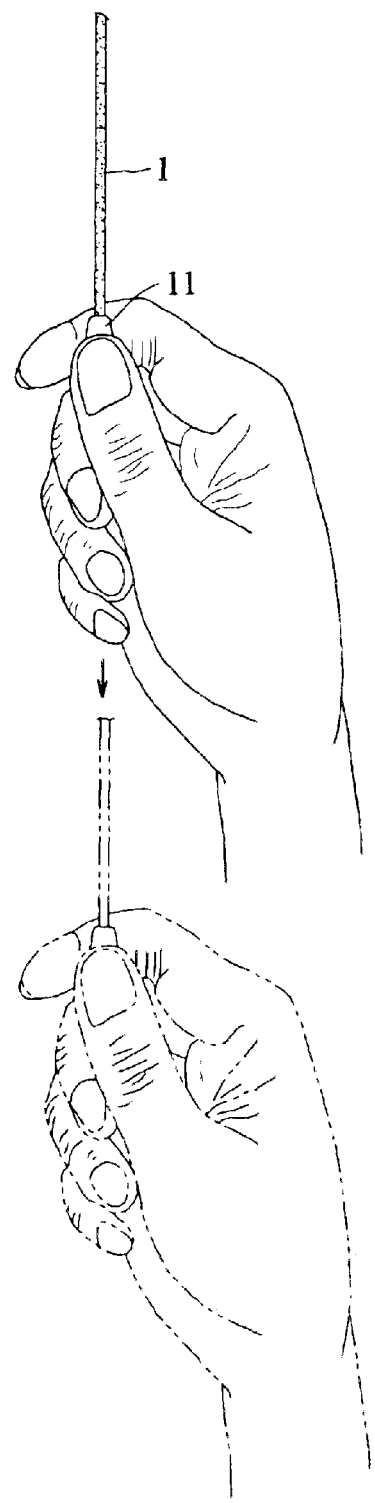
FIG. 3 is a schematic operational view of the conventional suspension control device in accordance with the prior art.
Figure 4:
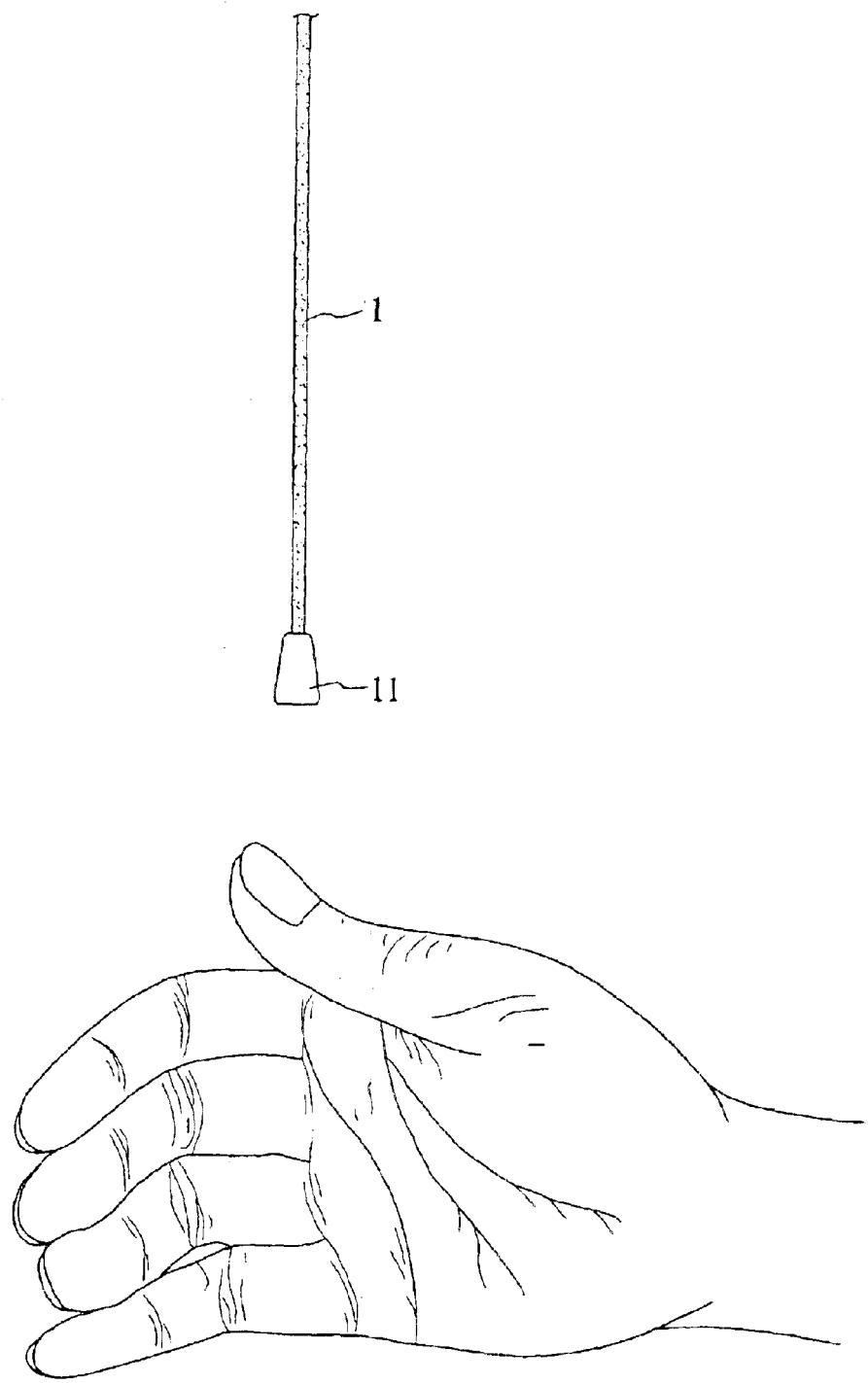
FIG. 4 is a schematic operational view of the conventional suspension control device in accordance with the prior art.
Figure 5:
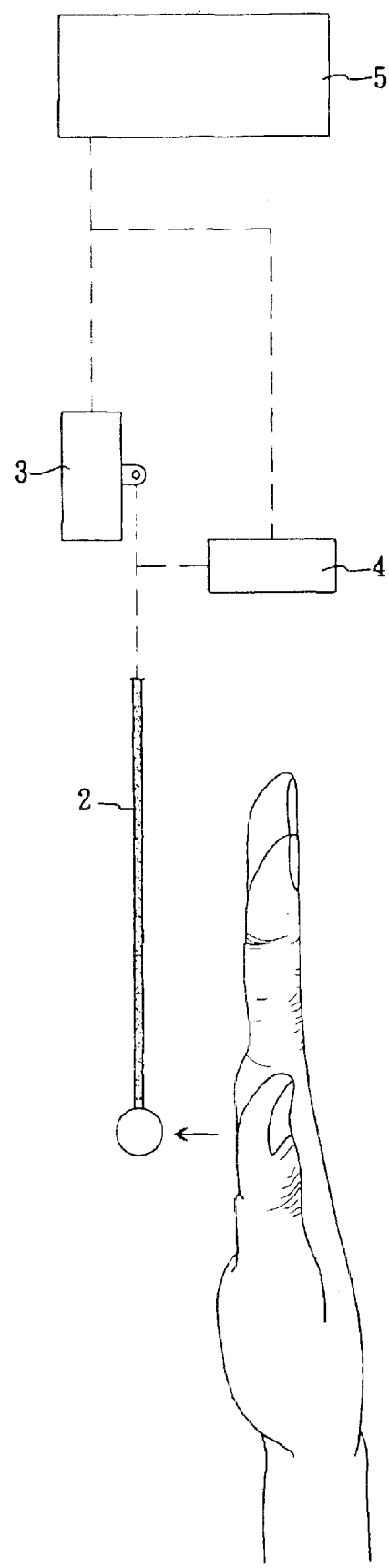
FIG. 5 is a schematic plan operational view of a suspension control device in accordance with the preferred embodiment of the present invention.

Referring to FIG. 5, a suspension control device in accordance with the preferred embodiment of the present invention comprises a mechanical switch 3 connected to an overhead electric appliance 5 (such as a ceiling fan, an electric lamp or the like), a control cord 2 having an end connected to the mechanical switch 3, and an electronic sensor 4 having a first side connected to the control cord 2 and a second side connected to the electric appliance 5.

Preferably, the control cord 2 is flexible and has a bar-shape.

Preferably, the electronic sensor 4 is mounted on the control cord 2. In addition, the electronic sensor 4 is connected to the mechanical switch 3 in a parallel manner, so that the electronic sensor 4 and the mechanical switch 3 can produce a control signal to the electric appliance 5 synchronously.

In addition, the electronic sensor 4 is a photoelectric type sensor, static electric type sensor, capacitance type sensor, resistance type sensor, electric current type sensor, piezoelectric type sensor, vibration type sensor, thermal sensitive type sensor, magnetic type sensor or the like.

In operation, when the control cord 2 is pulled downward by the user, the mechanical switch 3 is switched to produce a control signal so as to control operation of the electric appliance 5. Alternatively, when the user's one hand touches or approaches the control cord 2, the electronic sensor 4 detects movement or vibration of the control cord 2 and produces and sends a control signal to the electric appliance 5, so as to control operation of the electric appliance 5. In addition, the electronic sensor 4 can produce the control signal when the user contacts the control cord 2 in a non-touch manner, such as by patting or the like.

Thus, the suspension control device can be used to operate the electric appliance 5 easily and conveniently without a directional limit. In addition, the user can operate the suspension control device easily and conveniently without having to exert a large force on the suspension control device.

In addition, the electronic sensor 4 is connected to the mechanical switch 3 in a parallel manner, so that when the control cord 2 is pulled downward by the user or when the user's one hand touches or approaches the control cord 2, the electronic sensor 4 and the mechanical switch 3 can produce the control signal simultaneously so as to control operation of the electric appliance 5.

Thus, when one of the electronic sensor 4 and the mechanical switch 3 is inoperative or worn out, the electric appliance 5 can be operated at the normal state. In addition, the user can pull, touch or approach the control cord 2 to control operation of the electric appliance 5, so that the suspension control device satisfies the requirements and customs of different users.

Although the invention has been explained in relation to its preferred embodiment(s) as mentioned above, it is to be understood that many other possible modifications and variations can be made without departing from the scope of the present invention. It is, therefore, contemplated that the appended claim or claims will cover such modifications and variations that fall within the true scope of the invention.

What is claimed is:

1. A suspension control device, comprising:
    a mechanical switch having a first side connected to an electric appliance;
    a control cord having an end connected to a second side of the mechanical switch; and
    an electronic sensor having a first side connected to the electric appliance and the first side of the mechanical switch and a second side connected to the end of the control cord and the second side of the mechanical switch.

2. The suspension control device in accordance with claim 1, wherein the control cord is flexible.

3. The suspension control device in accordance with claim 1, wherein the control cord has a bar-shape.

4. The suspension control device in accordance with claim 1, wherein the electronic sensor is mounted on the control cord.

5. The suspension control device in accordance with claim 1, wherein the electronic sensor is connected to the mechanical switch in a parallel manner, so that the electronic sensor and the mechanical switch produce a control signal to drive and operate the electric appliance synchronously.

6. The suspension control device in accordance with claim 1, wherein the electronic sensor is a photoelectric type sensor.

7. The suspension control device in accordance with claim 1, wherein the electronic sensor is a static electric type sensor.

8. The suspension control device in accordance with claim 1, wherein the electronic sensor is a capacitance type sensor.

9. The suspension control device in accordance with claim 1, wherein the electronic sensor is a resistance type sensor.

10. The suspension control device in accordance with claim 1, wherein the electronic sensor is an electric current type sensor.

11. The suspension control device in accordance with claim 1, wherein the electronic sensor is a piezoelectric type sensor.

12. The suspension control device in accordance with claim 1, wherein the electronic sensor is a vibration type sensor.

13. The suspension control device in accordance with claim 1, wherein the electronic sensor is a thermal sensitive type sensor.

14. The suspension control device in accordance with claim 1, wherein the electronic sensor is a magnetic type sensor.

* * * * *